(12) United States Patent
Kang et al.

(10) Patent No.: US 12,255,472 B2
(45) Date of Patent: *Mar. 18, 2025

(54) SWITCH DURATION SETTING FOR BATTERY STRING STATE OF CHARGE BALANCING

(71) Applicant: GM GLOBAL TECHNOLOGY OPERATIONS LLC, Detroit, MI (US)

(72) Inventors: Jun-mo Kang, Ann Arbor, MI (US); Charles W. Wampler, II, Birmingham, MI (US); Dave G. Rich, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 537 days.

This patent is subject to a terminal disclaimer.

(21) Appl. No.: 17/575,846

(22) Filed: Jan. 14, 2022

(65) Prior Publication Data

US 2023/0179001 A1 Jun. 8, 2023

Related U.S. Application Data

(63) Continuation-in-part of application No. 17/541,115, filed on Dec. 2, 2021, now abandoned.

(51) Int. Cl.
*H01M 10/44* (2006.01)
*G01R 31/382* (2019.01)
(Continued)

(52) U.S. Cl.
CPC .......... *H02J 7/0014* (2013.01); *G01R 31/382* (2019.01); *H01M 10/482* (2013.01);
(Continued)

(58) Field of Classification Search
CPC ...... H02J 7/0014; H02J 7/0024; H02J 7/0048; H01M 10/46; H01M 10/44; H01M 10/482;
(Continued)

(56) References Cited

U.S. PATENT DOCUMENTS

| 2023/0170710 A1* | 6/2023 | Kang | ............ H02J 7/0024 320/117 |
|---|---|---|---|
| 2023/0231391 A1* | 7/2023 | Kang | ............ H02J 7/0014 |

FOREIGN PATENT DOCUMENTS

| DE | 102020102727 A1 | 9/2020 |
|---|---|---|
| DE | 102020102806 A1 | 9/2020 |

OTHER PUBLICATIONS

U.S. Appl. No. 17/541,115, filed Dec. 2, 2021, Kang et al.
(Continued)

*Primary Examiner* — Edward Tso

(57) ABSTRACT

A battery system includes: two battery modules, each including three strings of battery cells that are configured to, at different times be: connected in series and to a first positive terminal via first ones of switches; connected in parallel and to a second positive terminal via second ones of the switches; and disconnected from both of the first and second positive terminals; and a switch control module configured to: determine state of charges (SOCs) of the strings, respectively; determine periods of phases, respectively, based on the SOCs; determine first periods for connecting ones of the strings in parallel; divide one of the phases into N equal length periods; selectively decrease N; when a number of the first periods that end closest to one of N period endings is at least a predetermined value, adjust the first periods to the respective closest ones of the N period endings.

20 Claims, 13 Drawing Sheets

1 Battery module includes 3 x 12V strings

(51) Int. Cl.
    *H01M 10/46*     (2006.01)
    *H01M 10/48*     (2006.01)
    *H02J 7/00*     (2006.01)

(52) U.S. Cl.
    CPC .......... *H02J 7/0024* (2013.01); *H02J 7/0048* (2020.01); *H01M 2220/20* (2013.01)

(58) Field of Classification Search
    CPC ............ H01M 10/441; H01M 2220/20; G01R 31/382
    USPC ......................... 320/107, 116, 117, 132, 149
    See application file for complete search history.

(56) References Cited

OTHER PUBLICATIONS

U.S. Appl. No. 17/541,115, filed Dec. 2, 2021, Jun-mo Kang et al.
German Office Action from counterpart DE1020221240738, dated Jul. 4, 2024.

\* cited by examiner

SWITCH DURATION SETTING FOR BATTERY STRING STATE OF CHARGE BALANCING

CROSS-REFERENCE TO RELATED APPLICATIONS

The present disclosure is a continuation-in-part of U.S. patent application Ser. No. 17/541,115 filed on Dec. 2, 2021. The entire disclosures of the applications referenced above are incorporated herein by reference.

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to vehicles and more particularly to battery systems of vehicles.

Some types of vehicles include only an internal combustion engine that generates propulsion torque. Hybrid vehicles include both an internal combustion engine and one or more electric motors. Some types of hybrid vehicles utilize the electric motor and the internal combustion engine in an effort to achieve greater fuel efficiency than if only the internal combustion engine was used. Some types of hybrid vehicles utilize the electric motor and the internal combustion engine to achieve greater torque output than the internal combustion could achieve by itself.

Some example types of hybrid vehicles include parallel hybrid vehicles, series hybrid vehicles, and other types of hybrid vehicles. In a parallel hybrid vehicle, the electric motor works in parallel with the engine to combine power and range advantages of the engine with efficiency and regenerative braking advantages of electric motors. In a series hybrid vehicle, the engine drives a generator to produce electricity for the electric motor, and the electric motor drives a transmission. This allows the electric motor to assume some of the power responsibilities of the engine, which may permit the use of a smaller and possibly more efficient engine. The present application is applicable to electric vehicles, hybrid vehicles, and other types of vehicles.

SUMMARY

In a feature, a battery system includes: a first positive terminal; a second positive terminal; a negative terminal; switches; two battery modules, wherein each of the two battery modules includes three strings of battery cells that are configured to, at different times be: connected in series and to the first positive terminal via first ones of the switches; connected in parallel and to the second positive terminal via second ones of the switches; and disconnected from both of the first and second positive terminals; and a switch control module configured to: determine state of charges (SOCs) of the strings of battery cells, respectively; determine periods of phases, respectively, based on the SOCs; determine first periods for connecting ones of the strings in parallel during one of the phases; divide the one of the phases into N equal length periods with N period endings, respectively, one of the N period endings being at an end of the one of the phases; selectively decrease N; when a number of the first periods that end closest to the one of the N period endings is at least a predetermined value, adjust the first periods to the respective closest ones of the N period endings; and selectively actuate the switches based on the periods of the phases and the periods for the strings of battery cells.

In further features, the predetermined value is two.

In further features, the switch control module is configured to selectively decrease N based on the number of the first periods that are closest to the one of the N period endings.

In further features, the switch control module is configured to decrement N when the number of the first periods that are closest to the one of the N period endings is less than the predetermined value.

In further features, the switch control module is configured to decrement N by one.

In further features, the switch control module is configured to, when two first periods for connecting one of the strings in parallel during the one of the phases are separated by a period during which the one of the strings is to not be connected in parallel, joining the two first periods for connecting one of the strings in parallel during the one of the phases such that the two first periods are contiguous.

In further features, the switch control module is configured to set a first period for a first one of the strings of one of the battery modules to longer than a second period for a second one of the strings of the one of the battery modules during charging when a first SOC of the first one of the strings is less than a second SOC of the second one of the strings.

In further features, the switch control module is configured to set a first period for a first one of the strings of one of the battery modules to longer than a second period for a second one of the strings of the one of the battery modules during discharging when a first SOC of the first one of the strings is greater than a second SOC of the second one of the strings.

In further features, the switch control module is configured to selectively set a first period for a first of the phases to longer than a second period for a second one of the phases during charging based on the SOCs of the strings.

In further features, the switch control module is configured to selectively set a first period for a first of the phases to longer than a second period for a second one of the phases during discharging based on the SOCs of the strings.

In further features, the switch control module is configured to, based on minimizing an error between the SOCs of the strings of battery cells, determine the periods of the phases and the first periods for the strings.

In further features, the error is a sum of squared differences between the SOCs of the strings.

In further features, each of the strings includes multiple battery cells connected in series.

In further features, the multiple battery cells include four three volt battery cells.

In further features, the switch control module is configured to control the switches such that one of the strings is not at the same time connected to both the first positive terminal and the second positive terminal.

In further features: the first positive terminal is configured to output a first reference potential; the second positive terminal is configured to output a second reference potential; and the first reference potential is greater than the second reference potential.

In a feature, a method for a battery includes: determining state of charges (SOCs) of strings of battery cells, respectively, of a battery, the battery including: a first positive terminal; a second positive terminal; a negative terminal; switches; two battery modules, wherein each of the two battery modules includes three strings of the battery cells that are configured to, at different times be: connected in series and to the first positive terminal via first ones of the switches; connected in parallel and to the second positive terminal via second ones of the switches; and disconnected from both of the first and second positive terminals; determining periods of phases, respectively, based on the SOCs; determining first periods for connecting ones of the strings in parallel during one of the phases; dividing the one of the phases into N equal length periods with N period endings, respectively, one of the N period endings being at an end of the one of the phases; selectively decreasing N; when a number of the first periods that end closest to the one of the N period endings is at least a predetermined value, adjusting the first periods to the respective closest ones of the N period endings; and selectively actuating the switches based on the periods of the phases and the periods for the strings of battery cells.

In further features, the predetermined value is two.

In further features, selectively decreasing N includes selectively decreasing N based on the number of the first periods that are closest to the one of the N period endings.

In further features, selectively decreasing N includes decrementing N when the number of the first periods that are closest to the one of the N period endings is less than the predetermined value.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A vehicle includes a battery having a first terminal on a housing of the battery for outputting a first operating voltage (e.g., 48 V) and a second output terminal on the housing for outputting a second operating voltage (e.g., 12 V). The battery includes a plurality of battery modules and a plurality of switches. Each battery module includes a plurality of battery strings, and each battery string includes a plurality of battery cells. The switches are configured to connect strings together in series or individually to a terminal. The strings can also be disconnected from the first and second output terminals.

According to the present application, a model predictive control (MPC) module uses estimates of SOCs of the battery strings and controls the switches to minimize SOC error across the battery strings and battery modules. This ensures that each battery string is charged and discharged as evenly as possible and maximizes battery life.

To evenly distribute the energy flows to and from the modules and strings, the MPC module controls the switches to execute a series of phases where the modules take turns connecting to the first and second output terminals. During some phases, the individual strings within a module can vary their connection times within the phase. The MPC module could split up the period for a string to be charged or discharged during a phase into two or more separate periods. This may be done, for example, to maintain approximately consistent characteristics (e.g., voltage and current) to and from the battery. This, however, increases switching and also requires more computational effort.

The present application involves not allowing for splitting of the period and setting of the period for the strings of a battery module such that a predetermined minimum number (e.g., 2) of the strings will be connected throughout a phase during which that battery module is to be operated in a parallel (P) mode. This improves computational efficiency (less computational effort is needed) and decreases switching. Decreasing switching increases lifetime.

Figure 1:
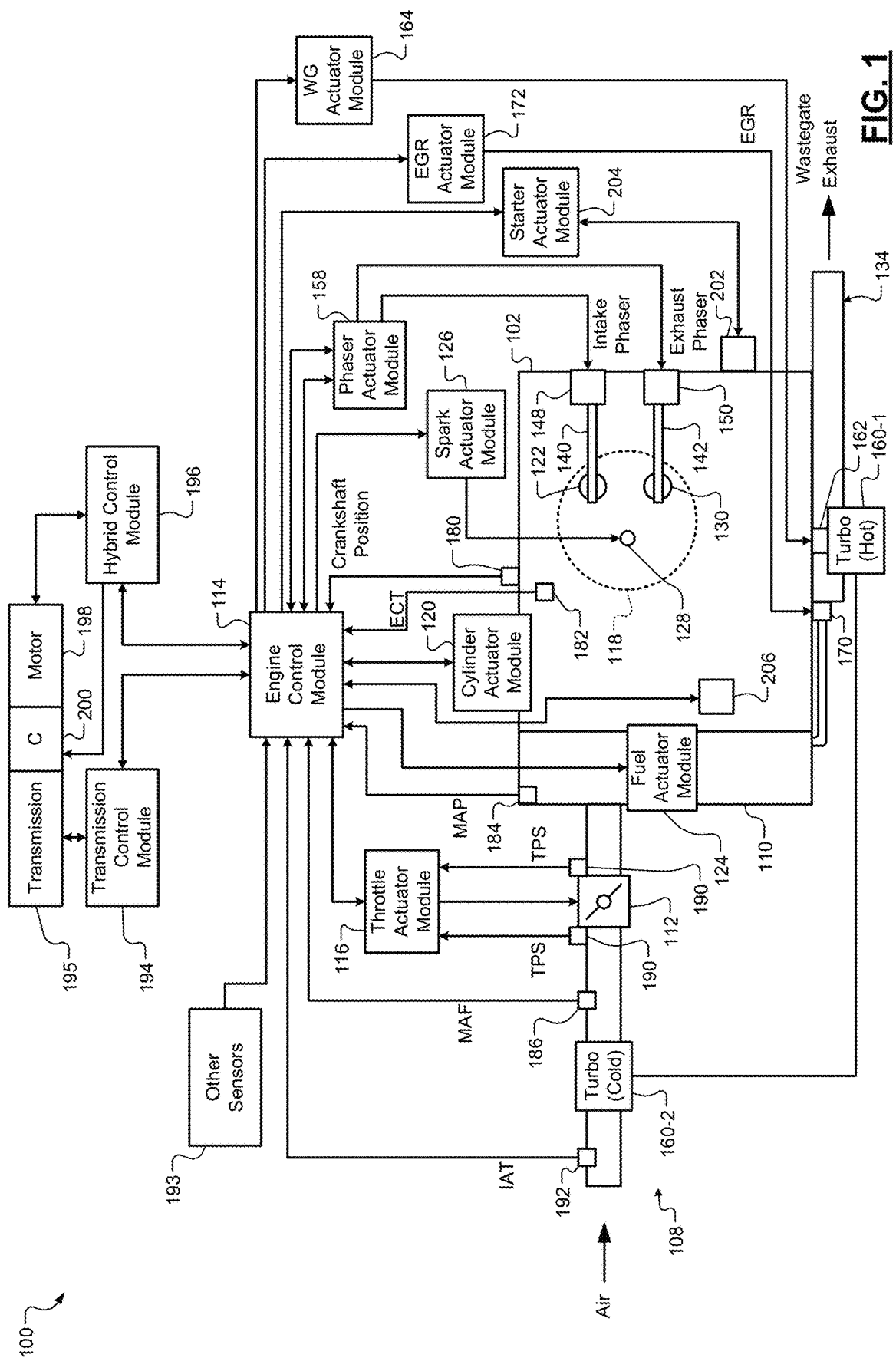
FIG. 1 is a functional block diagram of an example engine control system.

Referring now to FIG. 1, a functional block diagram of an example powertrain system 100 is presented. The powertrain system 100 of a vehicle includes an engine 102 that combusts an air/fuel mixture to produce torque. The vehicle may be non-autonomous or autonomous.

Air is drawn into the engine 102 through an intake system 108. The intake system 108 may include an intake manifold 110 and a throttle valve 112. For example only, the throttle valve 112 may include a butterfly valve having a rotatable blade. An engine control module (ECM) 114 controls a throttle actuator module 116, and the throttle actuator module 116 regulates opening of the throttle valve 112 to control airflow into the intake manifold 110.

Air from the intake manifold 110 is drawn into cylinders of the engine 102. While the engine 102 includes multiple cylinders, for illustration purposes a single representative cylinder 118 is shown. For example only, the engine 102 may include 2, 3, 4, 5, 6, 8, 10, and/or 12 cylinders. The ECM 114 may instruct a cylinder actuator module 120 to selectively deactivate some of the cylinders under some circumstances, which may improve fuel efficiency.

The engine 102 may operate using a four-stroke cycle or another suitable engine cycle. The four strokes of a four-stroke cycle, described below, will be referred to as the intake stroke, the compression stroke, the combustion stroke, and the exhaust stroke. During each revolution of a crankshaft (not shown), two of the four strokes occur within the cylinder 118. Therefore, two crankshaft revolutions are necessary for the cylinder 118 to experience all four of the strokes. For four-stroke engines, one engine cycle may correspond to two crankshaft revolutions.

When the cylinder 118 is activated, air from the intake manifold 110 is drawn into the cylinder 118 through an intake valve 122 during the intake stroke. The ECM 114 controls a fuel actuator module 124, which regulates fuel injection to achieve a desired air/fuel ratio. Fuel may be injected into the intake manifold 110 at a central location or at multiple locations, such as near the intake valve 122 of each of the cylinders. In various implementations (not shown), fuel may be injected directly into the cylinders or into mixing chambers/ports associated with the cylinders. The fuel actuator module 124 may halt injection of fuel to cylinders that are deactivated.

The injected fuel mixes with air and creates an air/fuel mixture in the cylinder 118. During the compression stroke, a piston (not shown) within the cylinder 118 compresses the air/fuel mixture. The engine 102 may be a compression-ignition engine, in which case compression causes ignition of the air/fuel mixture. Alternatively, the engine 102 may be a spark-ignition engine, in which case a spark actuator module 126 energizes a spark plug 128 in the cylinder 118 based on a signal from the ECM 114, which ignites the air/fuel mixture. Some types of engines, such as homogenous charge compression ignition (HCCI) engines may perform both compression ignition and spark ignition. The timing of the spark may be specified relative to the time when the piston is at its topmost position, which will be referred to as top dead center (TDC).

The spark actuator module 126 may be controlled by a timing signal specifying how far before or after TDC to generate the spark. Because piston position is directly related to crankshaft rotation, operation of the spark actuator module 126 may be synchronized with the position of the crankshaft. The spark actuator module 126 may disable provision of spark to deactivated cylinders or provide spark to deactivated cylinders.

During the combustion stroke, the combustion of the air/fuel mixture drives the piston down, thereby driving the crankshaft. The combustion stroke may be defined as the time between the piston reaching TDC and the time when the piston returns to a bottom most position, which will be referred to as bottom dead center (BDC).

During the exhaust stroke, the piston begins moving up from BDC and expels the byproducts of combustion through an exhaust valve 130. The byproducts of combustion are exhausted from the vehicle via an exhaust system 134.

The intake valve 122 may be controlled by an intake camshaft 140, while the exhaust valve 130 may be controlled by an exhaust camshaft 142. In various implementations, multiple intake camshafts (including the intake camshaft 140) may control multiple intake valves (including the intake valve 122) for the cylinder 118 and/or may control the intake valves (including the intake valve 122) of multiple banks of cylinders (including the cylinder 118). Similarly, multiple exhaust camshafts (including the exhaust camshaft 142) may control multiple exhaust valves for the cylinder 118 and/or may control exhaust valves (including the exhaust valve 130) for multiple banks of cylinders (including the cylinder 118). While camshaft-based valve actuation is shown and has been discussed, camless valve actuators may be implemented. While separate intake and exhaust camshafts are shown, one camshaft having lobes for both the intake and exhaust valves may be used.

The cylinder actuator module 120 may deactivate the cylinder 118 by disabling opening of the intake valve 122 and/or the exhaust valve 130. The time when the intake valve 122 is opened may be varied with respect to piston TDC by an intake cam phaser 148. The time when the exhaust valve 130 is opened may be varied with respect to piston TDC by an exhaust cam phaser 150. A phaser actuator module 158 may control the intake cam phaser 148 and the exhaust cam phaser 150 based on signals from the ECM 114. In various implementations, cam phasing may be omitted. Variable valve lift (not shown) may also be controlled by the phaser actuator module 158. In various other implementations, the intake valve 122 and/or the exhaust valve 130 may be controlled by actuators other than a camshaft, such as electromechanical actuators, electrohydraulic actuators, electromagnetic actuators, etc.

The engine 102 may include zero, one, or more than one boost device that provides pressurized air to the intake manifold 110. For example, FIG. 1 shows a turbocharger including a turbocharger turbine 160-1 that is driven by exhaust gases flowing through the exhaust system 134. A supercharger is another type of boost device.

The turbocharger also includes a turbocharger compressor 160-2 that is driven by the turbocharger turbine 160-1 and that compresses air leading into the throttle valve 112. A wastegate (WG) 162 controls exhaust flow through and bypassing the turbocharger turbine 160-1. Wastegates can also be referred to as (turbocharger) turbine bypass valves. The wastegate 162 may allow exhaust to bypass the turbocharger turbine 160-1 to reduce intake air compression provided by the turbocharger. The ECM 114 may control the turbocharger via a wastegate actuator module 164. The wastegate actuator module 164 may modulate the boost of the turbocharger by controlling an opening of the wastegate 162.

A cooler (e.g., a charge air cooler or an intercooler) may dissipate some of the heat contained in the compressed air charge, which may be generated as the air is compressed. Although shown separated for purposes of illustration, the turbocharger turbine 160-1 and the turbocharger compressor 160-2 may be mechanically linked to each other, placing intake air in close proximity to hot exhaust. The compressed air charge may absorb heat from components of the exhaust system 134.

The engine 102 may include an exhaust gas recirculation (EGR) valve 170, which selectively redirects exhaust gas back to the intake manifold 110. The EGR valve 170 may receive exhaust gas from upstream of the turbocharger turbine 160-1 in the exhaust system 134. The EGR valve 170 may be controlled by an EGR actuator module 172.

Crankshaft position may be measured using a crankshaft position sensor 180. An engine speed may be determined based on the crankshaft position measured using the crankshaft position sensor 180. A temperature of engine coolant may be measured using an engine coolant temperature (ECT) sensor 182. The ECT sensor 182 may be located within the engine 102 or at other locations where the coolant is circulated, such as a radiator (not shown).

A pressure within the intake manifold 110 may be measured using a manifold absolute pressure (MAP) sensor 184. In various implementations, engine vacuum, which is the difference between ambient air pressure and the pressure within the intake manifold 110, may be measured. A mass flow rate of air flowing into the intake manifold 110 may be measured using a mass air flow (MAF) sensor 186. In various implementations, the MAF sensor 186 may be located in a housing that also includes the throttle valve 112.

Position of the throttle valve 112 may be measured using one or more throttle position sensors (TPS) 190. A temperature of air being drawn into the engine 102 may be measured using an intake air temperature (IAT) sensor 192. One or more other sensors 193 may also be implemented. The other sensors 193 include an accelerator pedal position (APP) sensor, a brake pedal position (BPP) sensor, may include a clutch pedal position (CPP) sensor (e.g., in the case of a manual transmission), and may include one or more other types of sensors. An APP sensor measures a position of an accelerator pedal within a passenger cabin of the vehicle. A BPP sensor measures a position of a brake pedal within a passenger cabin of the vehicle. A CPP sensor measures a position of a clutch pedal within the passenger cabin of the vehicle. The other sensors 193 may also include one or more acceleration sensors that measure longitudinal (e.g., fore/aft) acceleration of the vehicle and latitudinal acceleration of the vehicle. An accelerometer is an example type of acceleration sensor, although other types of acceleration sensors may be used. The ECM 114 may use signals from the sensors to make control decisions for the engine 102.

The ECM 114 may communicate with a transmission control module 194, for example, to coordinate engine operation with gear shifts in a transmission 195. The ECM 114 may communicate with a hybrid control module 196, for example, to coordinate operation of the engine 102 and an electric motor 198. While the example of one electric motor is provided, multiple electric motors may be implemented. The electric motor 198 may be a permanent magnet electric motor or another suitable type of electric motor that outputs voltage based on back electromagnetic force (EMF) when free spinning, such as a direct current (DC) electric motor or a synchronous electric motor. In various implementations, various functions of the ECM 114, the transmission control module 194, and the hybrid control module 196 may be integrated into one or more modules.

Each system that varies an engine parameter may be referred to as an engine actuator. Each engine actuator has an associated actuator value. For example, the throttle actuator module 116 may be referred to as an engine actuator, and the throttle opening area may be referred to as the actuator value. In the example of FIG. 1, the throttle actuator module 116 achieves the throttle opening area by adjusting an angle of the blade of the throttle valve 112.

The spark actuator module 126 may also be referred to as an engine actuator, while the corresponding actuator value may be the amount of spark advance relative to cylinder TDC. Other engine actuators may include the cylinder actuator module 120, the fuel actuator module 124, the phaser actuator module 158, the wastegate actuator module 164, and the EGR actuator module 172. For these engine actuators, the actuator values may correspond to a cylinder activation/deactivation sequence, fueling rate, intake and exhaust cam phaser angles, target wastegate opening, and EGR valve opening, respectively.

The ECM 114 may control the actuator values in order to cause the engine 102 to output torque based on a torque request. The ECM 114 may determine the torque request, for example, based on one or more driver inputs, such as an APP, a BPP, a CPP, and/or one or more other suitable driver inputs. The ECM 114 may determine the torque request, for example, using one or more functions or lookup tables that relate the driver input(s) to torque requests.

Under some circumstances, the hybrid control module 196 controls the electric motor 198 to output torque, for example, to supplement engine torque output. The hybrid control module 196 may also control the electric motor 198 to output torque for vehicle propulsion at times when the engine 102 is shut down.

The hybrid control module 196 applies electrical power from a battery 208 to the electric motor 198 to cause the electric motor 198 to output positive torque. The battery is discussed further below. The electric motor 198 may output torque, for example, to an input shaft of the transmission 195, to an output shaft of the transmission 195, or to another component. A clutch 200 may be implemented to couple the electric motor 198 to the transmission 195 and to decouple the electric motor 198 from the transmission 195. One or more gearing devices may be implemented between an output of the electric motor 198 and an input of the transmission 195 to provide one or more predetermined gear ratios between rotation of the electric motor 198 and rotation of the input of the transmission 195. In various implementations, the electric motor 198 may be omitted.

The ECM 114 starts the engine 102 via a starter motor 202. The ECM 114 or another suitable module of the vehicle engages the starter motor 202 with the engine 102 for an engine startup event. For example only, the ECM 114 may engage the starter motor 202 with the engine 102 when a key ON command is received. A driver may input a key ON command, for example, via actuating one or more ignition keys, buttons, and/or switches of the vehicle or of a key fob of the vehicle. The starter motor 202 may engage a flywheel coupled to the crankshaft or one or more other suitable components that drive rotation of the crankshaft.

The ECM 114 may also start the engine in response to an auto-start command during an auto-stop/start event or to an engine start command for a sailing event. Auto-stop/start events include shutting down the engine 102 while the vehicle is stopped, the driver has depressed the brake pedal, and the driver has not input a key OFF command. An auto-start command may be generated while the engine 102 is shut down for an auto-stop/start event, for example, when a driver releases the brake pedal and/or depresses the accelerator pedal.

Sail events may include the ECM 114 shutting down the engine 102 when the vehicle is moving (e.g., vehicle speed greater than a predetermined speed, such as 50 miles per hour), the driver is not actuating the accelerator pedal, and the driver has not input a key OFF command. An engine start command may be generated while the engine 102 is shut down for a sail event, for example, when a driver depresses the accelerator pedal. The driver may input a key OFF command, for example, via actuating the one or more ignition keys, buttons, and/or switches, as discussed above.

A starter motor actuator, such as a solenoid, may actuate the starter motor 202 into engagement with the engine 102. For example only, the starter motor actuator may engage a starter pinion with a flywheel coupled to the crankshaft. In various implementations, the starter pinion may be coupled to the starter motor 202 via a driveshaft and a one-way clutch. A starter actuator module 204 controls the starter motor actuator and the starter motor 202 based on signals from a starter control module, as discussed further below. In various implementations, the starter motor 202 may be maintained in engagement with the engine 102.

In response to a command to start the engine 102 (e.g., an auto-start command, an engine start command for an end of a sail event, or when a key ON command is received), the starter actuator module 204 supplies current to the starter motor 202 to start the engine 102. The starter actuator module 204 may also actuate the starter motor actuator to engage the starter motor 202 with the engine 102. The starter actuator module 204 may supply current to the starter motor 202 after engaging the starter motor 202 with the engine 102, for example, to allow for teeth meshing.

The application of current to the starter motor 202 drives rotation of the starter motor 202, and the starter motor 202 drives rotation of the crankshaft (e.g., via the flywheel). The period of the starter motor 202 driving the crankshaft to start the engine 102 may be referred to as engine cranking.

The starter motor 202 draws power from the battery 208 to start the engine 102. Once the engine 102 is running after the engine startup event, the starter motor 202 disengages or is disengaged from the engine 102, and current flow to the starter motor 202 may be discontinued. The engine 102 may be considered running, for example, when an engine speed exceeds a predetermined speed, such as a predetermined idle speed. For example only, the predetermined idle speed may be approximately 700 revolutions per minute (rpm) or another suitable speed. Engine cranking may be said to be completed when the engine 102 is running.

A generator 206 converts mechanical energy of the engine 102 into alternating current (AC) power. For example, the generator 206 may be coupled to the crankshaft (e.g., via gears or a belt) and convert mechanical energy of the engine 102 into AC power by applying a load to the crankshaft. The generator 206 rectifies the AC power into DC power and stores the DC power in the battery 208. Alternatively, a rectifier that is external to the generator 206 may be implemented to convert the AC power into DC power. The generator 206 may be, for example, an alternator. In various implementations, such as in the case of a belt alternator starter (BAS), the starter motor 202 and the generator 206 may be implemented together.

Figure 2:
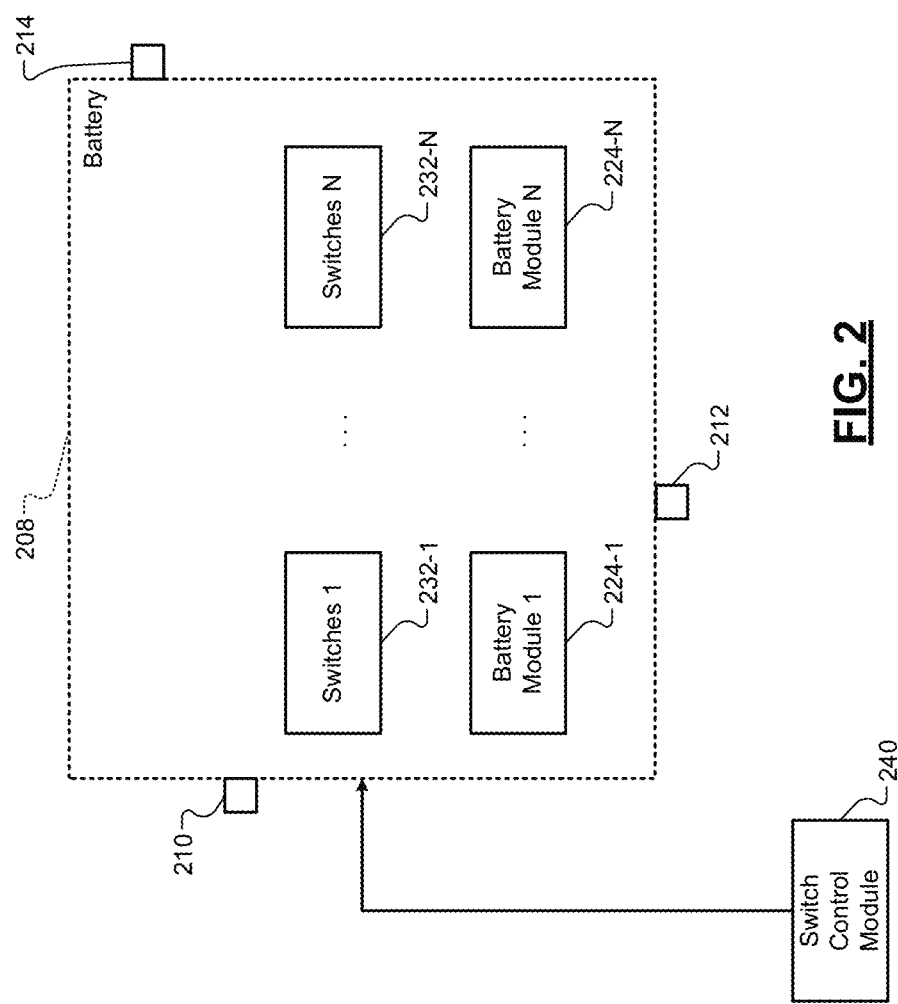
FIG. 2 is a functional block diagram an example battery system of a vehicle.

FIG. 2 is a functional block diagram of an example battery system of the vehicle. The battery 208 has at least two output terminals and a negative terminal to provide at least two direct current (DC) operating voltages. For example only, the battery 208 may have a first positive (e.g., 48 Volt (V) nominal) terminal 210, a negative terminal 212, and a second positive (e.g., 12 V nominal) terminal 214. While the example of the battery 208 having a 48 V nominal operating voltage and a 12 V nominal operating voltage is provided, the battery 208 may have one or more other operating voltages.

The battery 208 includes a plurality of battery modules, such as a first battery module 224-1, ..., and an N-th battery module 224-N ("battery modules 224"), where N is an integer greater than or equal to 2. In various implementations, N may be equal to 2, 3, 4, 5, 6, 8, 10, or 12.

As discussed further below with respect to FIG. 4, each of the battery modules 224 includes multiple battery strings. Each battery string may be individually replaceable. The ability to individually replace the battery strings may enable the battery 208 to include a shorter warranty period and have a lower warranty cost. The battery strings are also individually isolatable, for example, in the event of a fault in a battery string. In various implementations, the battery 208 may have the form factor of a standard automotive grade 12 V battery.

The battery 208 includes a plurality of switches, such as first switches 232-1, ... N-th switches 232-N (collectively "switches 232"). The switches 232 enable the battery strings 224 to be connected in series, parallel, or combinations of series and parallel to provide target output voltages and capacities at the output terminals.

A switch control module 240 controls the switches 232 to provide desired output voltages and capacities at the output terminals. The switch control module 240 controls the switches 232 using model predictive control (MPC) to as closely as possible balance the state of charges (SOCs) of the battery strings.

Figure 3A:
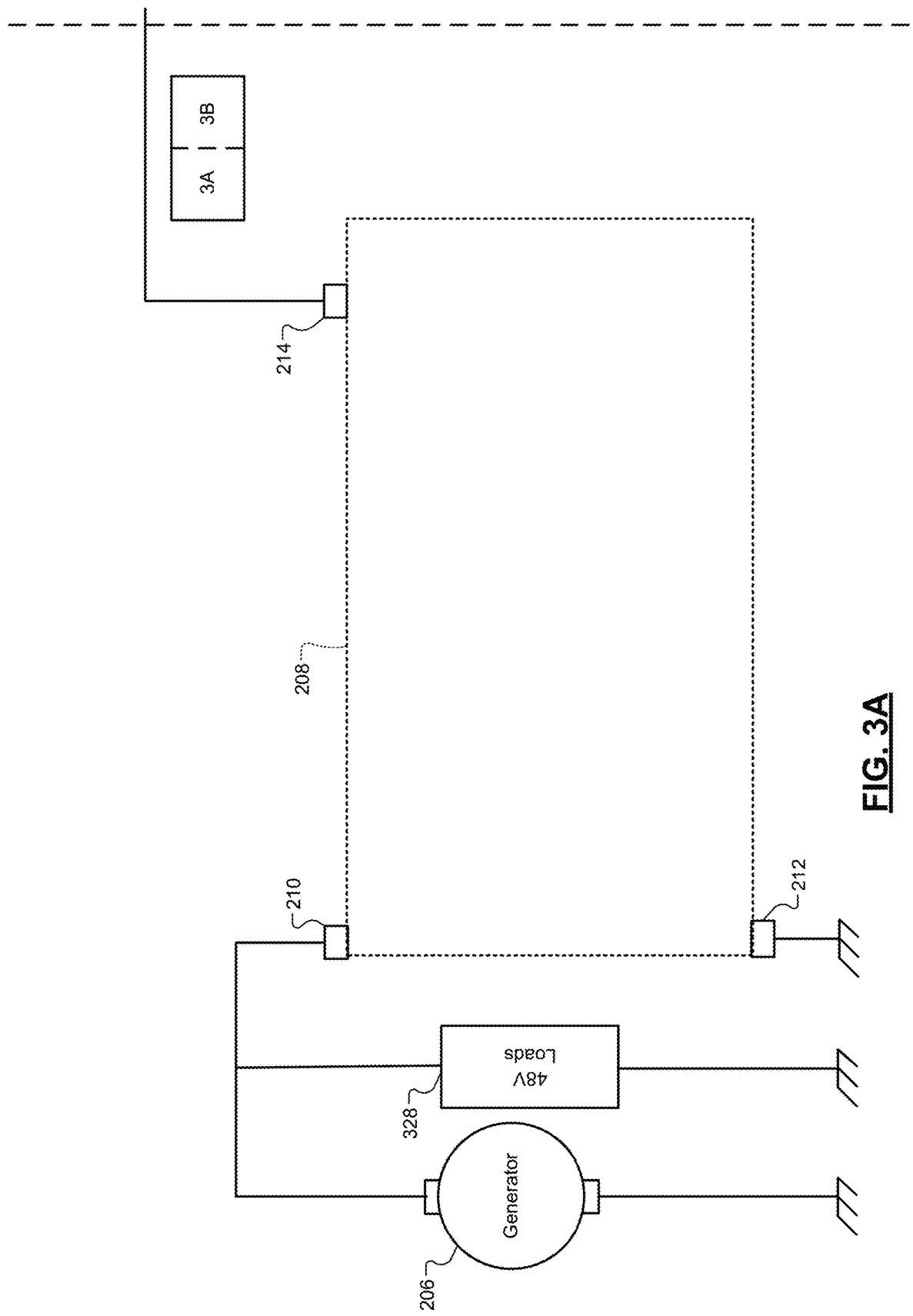
FIGS. 3A-3B are a schematic including an example implementation of a battery system.
Figure 3B:
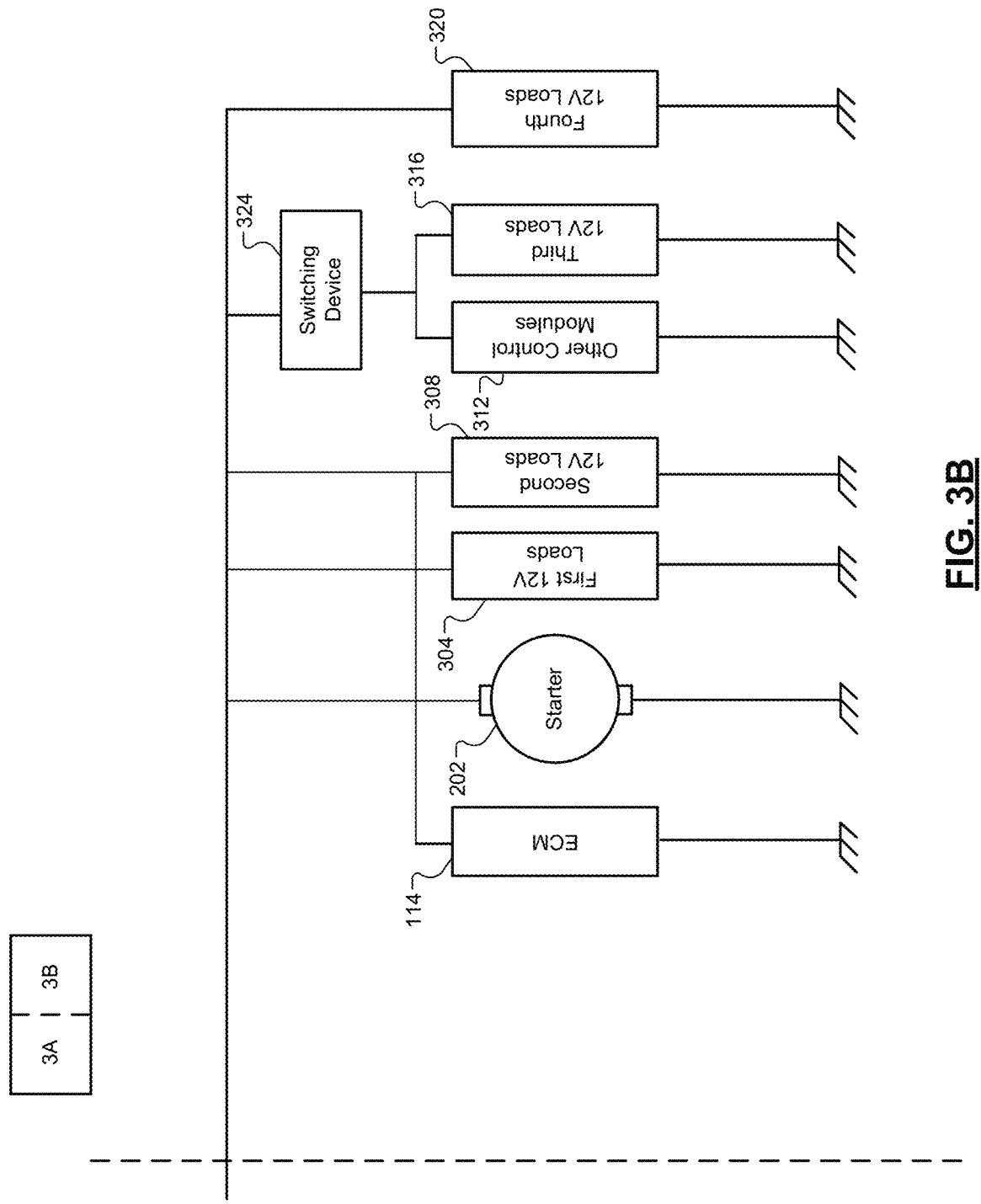

FIGS. 3A-3B are a schematic including an example battery system including the battery 208. Sets of the battery strings are connectable in series (via ones of the switches 232) to the first positive terminal 210 and the negative terminal 212 to provide a first nominal output voltage (e.g., 48 V) via the first positive terminal 210. Individual ones of the battery strings can be connected (via ones of the switches 232) to the second positive terminal 214 and the negative terminal 212 to provide a second nominal output voltage (e.g., 12 V) via the second positive terminal 214. How many of the battery strings are connected to the first positive terminal 210 and the second positive terminal 214 dictates the portions of the overall capacity of the battery 208 available at each of the positive terminals.

As shown in FIG. 3B, a first set of vehicle electrical components operates using one of the two or more operating voltages of the battery 208. For example, the first set of vehicle electrical components may be connected to the second positive terminal 214. The first set of vehicle electrical components may include, for example but not limited to, the ECM 114 and other control modules of the vehicle, the starter motor 202, and/or other electrical loads, such as first 12 V loads 304, second 12 V loads 308, other control modules 312, third 12 V loads 316, and fourth 12 V loads 320. In various implementations, a switching device 324 may be implemented.

As shown in FIG. 3A, a second set of vehicle electrical components operates using another one of the two or more operating voltages of the battery 208. For example, the second set of vehicle electrical components may be connected to the first positive terminal 210. The second set of vehicle electrical components may include, for example but not limited to, the generator 206 and various electrical loads, such as 48 V loads 328. The generator 206 may be controlled to charge the battery 208.

Each of the switches 232 may be an insulated gate bipolar transistor (IGBT), a field effect transistor (FET), such as a metal oxide semiconductor FET (MOSFET), or another suitable type of switch.

Figure 4:
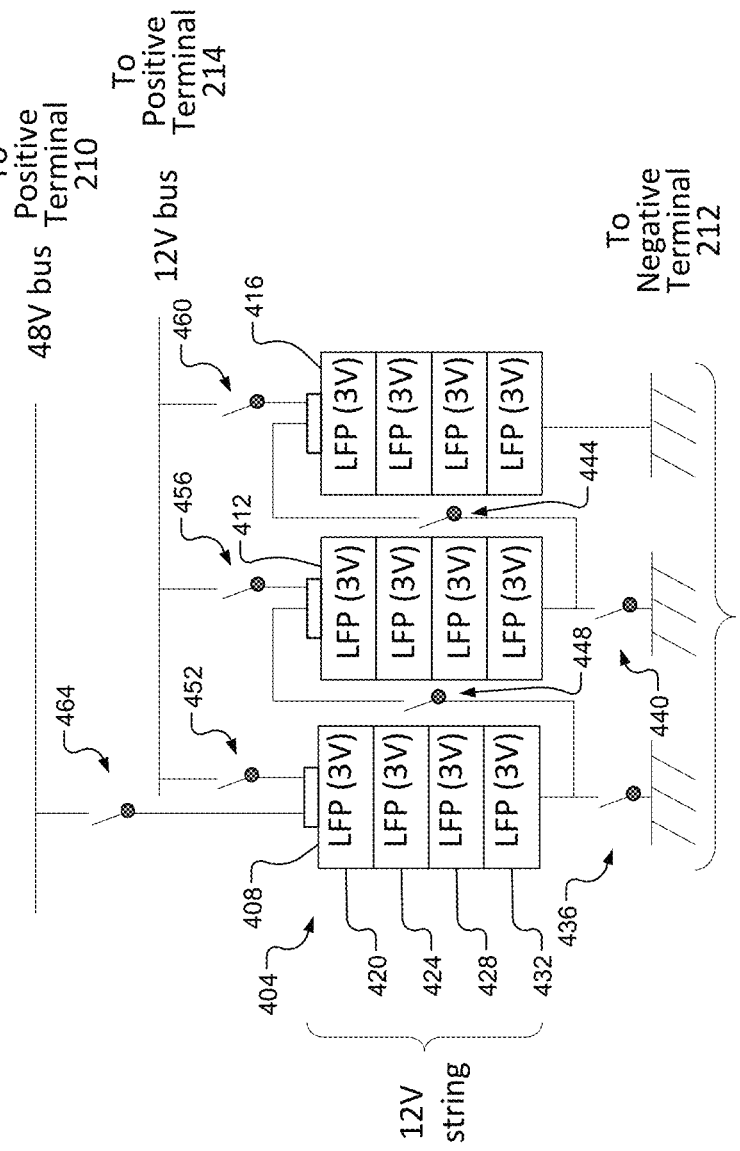
FIG. 4 is a functional block diagram of an example implementation of one battery module in an open (X) configuration.

FIG. 4 is a functional block diagram of an example implementation of one of the battery modules 224, numbered battery module 404, and one set of the switches 232. Each of the battery modules 224 may be identical, and each set of the switches 232 may be identical.

The battery module 404 includes three battery strings, 408, 412, and 416. The battery strings 408-416 are identical and each include four battery cells 420, 424, 428, and 432. The battery cells 420-432 are connected in series to provide the second operating voltage (e.g., 12 V). Each of the battery cells 420-432 may be, for example, a 3 V battery or have another suitable voltage to provide the second operating voltage. The battery cells 420-432 may be, for example lithium ferrophosphate (LFP) battery cells or have another suitable chemistry.

Negative terminals of the battery strings 408-416 are connected to the negative terminal 212. The negative terminals of the battery strings 408 and 412 are connected to the negative terminal 212 via switches 436 and 440, respectively, when the switches 436 and 440 are closed. The switches 436 and 440 can open to disconnect the negative terminals of the battery strings 408 and 412 from the negative terminal 212. The negative terminal of the battery string 416 may be directly connected to the negative terminal 212.

The positive terminal of the battery string 416 is connected with the negative terminal of the battery string 412 such that the battery strings 412 and 416 are connected in series when switch 444 is closed. The switch 444 can be opened to disconnect the positive terminal of the battery string 416 from the negative terminal of the battery string 412. The positive terminal of the battery string 412 is connected with the negative terminal of the battery string 408 such that the battery strings 412 and 408 are connected in series when switch 448 is closed. The switch 448 can be opened to disconnect the positive terminal of the battery string 412 from the negative terminal of the battery string 408.

Switches 452, 456, and 460 respectively connect and disconnect the positive terminals of the battery strings 408, 412, and 416 to and from a first bus (e.g., 12 V bus) that is connected to the second positive terminal 214. Switch 464 connects and disconnects the positive terminal of the battery string 408 to and from a second bus (e.g., a 48 V bus) that is connected to the first positive terminal 210.

The switch control module 240 controls switching of the switches of each of the battery modules 224. At any given time, the switch control module 240 may actuate the switches associated with a battery module such that the battery module is in an open (X) configuration, a series (S) configuration, or a parallel (P) configuration. FIG. 4 includes an example illustration of the battery module 404 in the open (X) configuration. When a battery module is in the open (X) configuration, all the battery strings of the battery module are disconnected from both the first positive terminal 210 and the second positive terminal 214.

Figure 5:
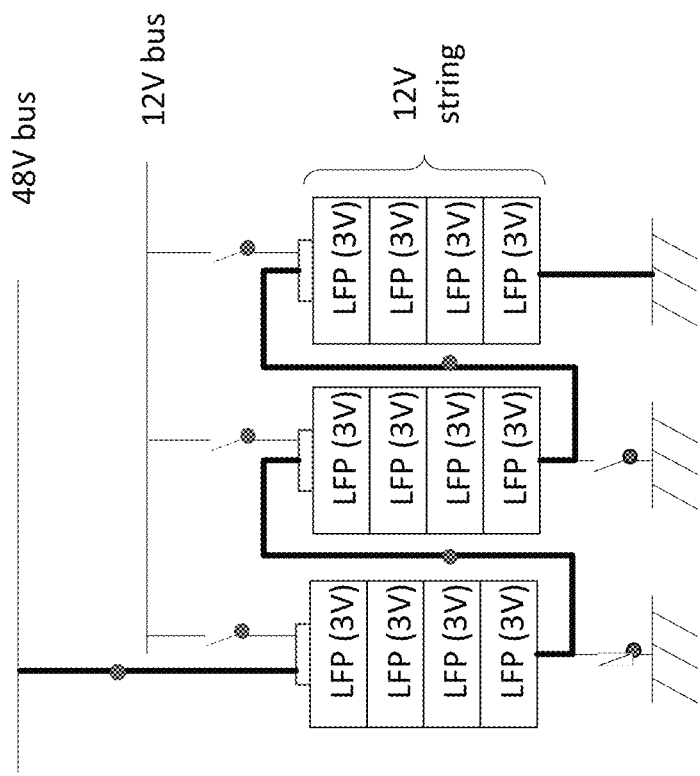
FIG. 5 includes an example illustration of the battery module in a series (S) configuration.

FIG. 5 includes an example illustration of the battery module 404 in the series (S) configuration. When a battery module is in the series (S) configuration, all the battery strings of the battery module are connected in series and to the first positive terminal 210. This is accomplished by closing switches 444, 448, and 464, and opening all of the other switches 436, 440, 452, 456, 460. None of the battery strings is connected to the second positive terminal 214 when the battery module is in the series (S) configuration.

Figure 6:
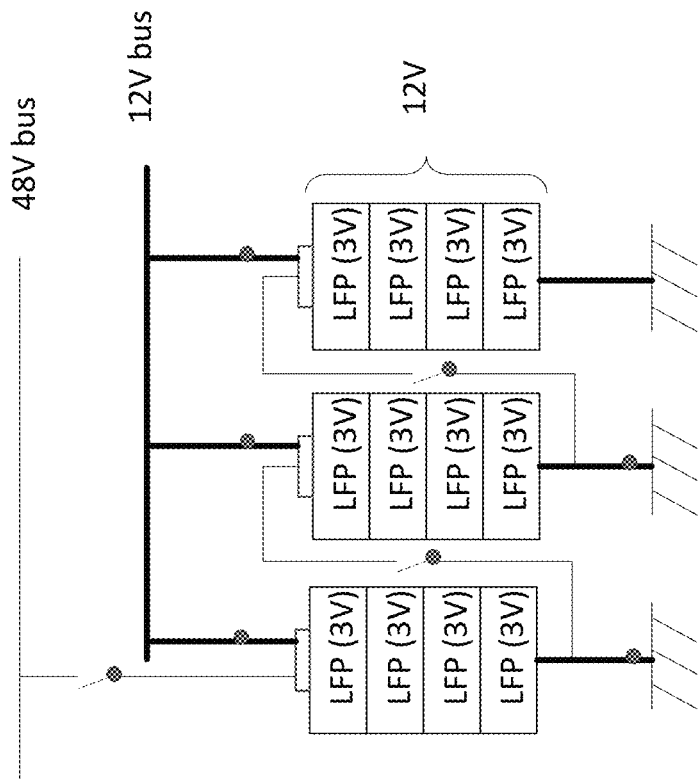
FIG. 6 includes an example illustration of the battery module in a parallel (P) configuration.

FIG. 6 includes an example illustration of the battery module 404 in the parallel (P) configuration. When a battery module is in the parallel (P) configuration, all the battery strings of the battery module are connected in parallel to the second positive terminal 214. This is accomplished by closing switches 452, 456, 460, 436, and 440, and opening all of the other switches 444, 448, and 464. None of the battery strings is connected to the first positive terminal 210 when the battery module is in the parallel (P) configuration.

Figure 7:
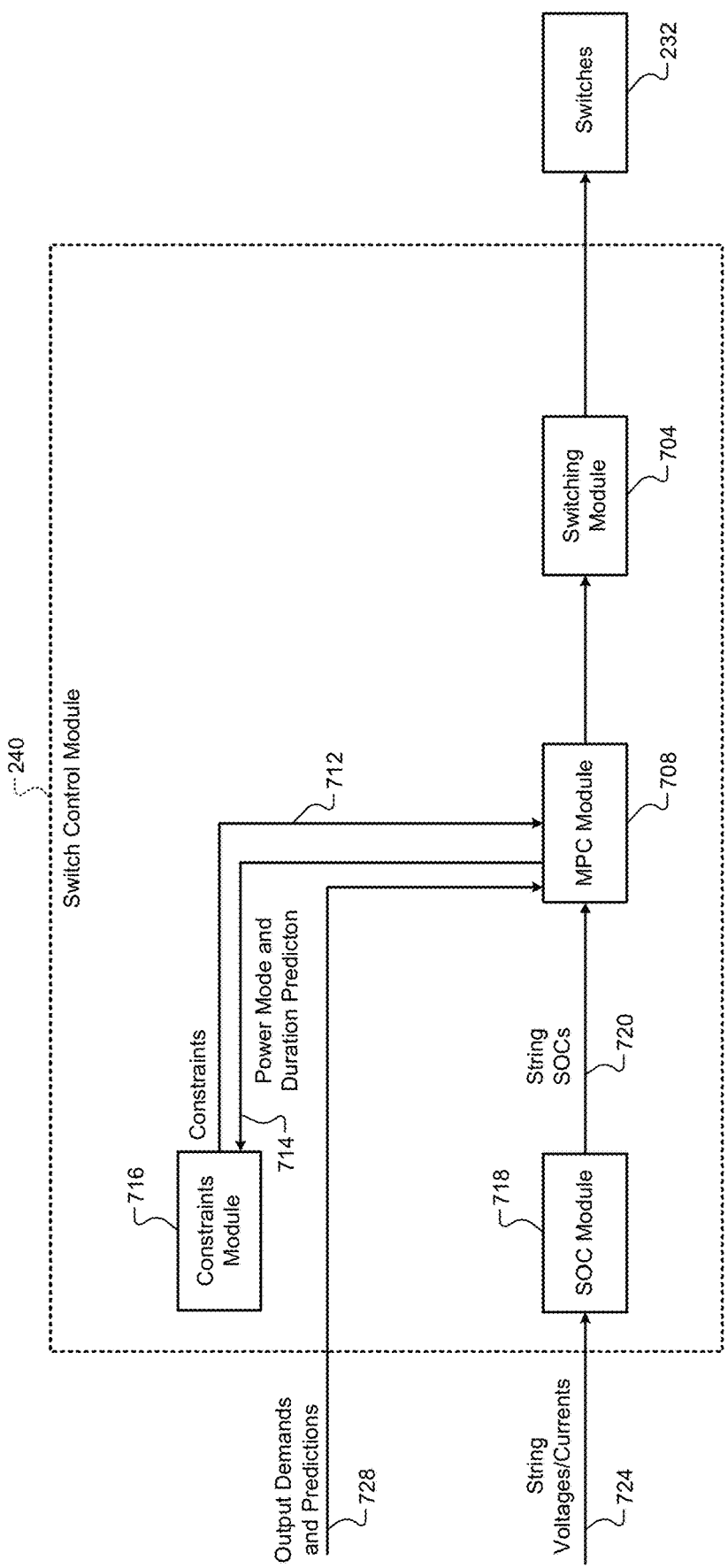
FIG. 7 is a functional block diagram of an example switch control module

FIG. 7 is a functional block diagram of an example implementation of the switch control module 240. A switching module 704 applies signals to (e.g., gate terminals) of the switches 232 to control actuation of the switches 232 and to control whether each of the battery modules 224 is in the open (X) state, the series (S) state, or the parallel (P) state.

The switching module 704 applies the signals based on input from a model predictive control (MPC) module 708. The MPC module 708 determines a present power mode based on one or more operating parameters and generates the output to the switching module 704 based on the present power mode. The MPC module 708 generates the output further based on constraints 712 set by a constraint module 716. Examples of the constraints 712 include, for example, a battery string cannot be connected to either the first or second positive terminal 210 and 214 when its battery module is in the X connection. A battery string cannot be connected to both the first and second positive terminals 210 and 214 at the same time. A battery string cannot be connected multiple times to the second positive terminal 214 when that battery module is to be connected in the parallel (P) mode. Phase durations may be constrained to meet the demand at the first positive terminal 210. The duration of connection of each string may be limited (constrained) to the end of the phase. The number of channels (battery strings) per battery module may be constrained to meet a demand at the second positive terminal 210.

One, more than one, or all of the constraints 712 may be fixed. In various implementations, one or more of the constraints 712 may be variable. The constraints module 716 may set variable constraints based on one or more operating parameters 714. Examples of the operating parameters 714 include, for example, the present power mode, a predicted duration of the present power mode, and other example operating parameters.

A state of charge (SOC) module 718 determines a present state of charge (SOC) 720 of each of the battery strings. In other words, the SOC module 718 determines present SOCs 720 of the battery strings, respectively. The SOC module 718 may determine the present SOC of a battery string, for example, based on at least one of a voltage across the battery string and current to and from that battery string. In various implementations, the SOC module 718 may determine the SOC of a battery based on impedance of the battery, such as to more precisely relate voltage and current to SOC. The SOC module 718 may determine the present SOC of a battery string using at least one of an equation and a lookup table that relates voltage and/or current to SOC. The SOC module 718 does this for each battery string. Voltages and currents of the battery strings 724 may be measured using voltage and current sensors, respectively.

The MPC module 708 controls switching of the switches (via the switching module 704) to minimize an error (e.g., a sum of squared differences (or errors)) between the SOCs of the battery strings, respectively, for the present power mode. The MPC module 708 may control switching of the switches further based on present output demands via the first and second positive terminals 210 and 214 and predicted output demands from the first and second positive terminals 210 and 214. The present and predicted output demands are illustrated by 728.

To balance the SOCs of the strings 720, using MPC the MPC module 708 sets phase durations for each of three phases (phase 1, phase 2, and phase 3), a number of battery strings connected when in the P mode, and a duration that each of the battery strings is connected in the P mode. Each power mode has an associated set of configurations (X mode, P mode, or S mode) of the battery modules 224 for that power mode. A table illustrating power modes and the battery module modes for each phase is provided below. The MPC module 708 cycles through the phases (phase 1, phase 2, phase 3, then back to phase 1, etc.) repeatedly until the power mode is changed.

| Power Mode | Phase 1 | Phase 2 | Phase 3 | Situation |
|---|---|---|---|---|
| 1(XXX mode) | XXX | XXX | XXX | OFF |
| 2(XXP mode) | XXP | PXX | XPX | 12 V sleep mode |
| 3(XXS mode) | XXS | SXX | XSX | 48 V low power mode with diagnostic |

| Power Mode | Phase 1 | Phase 2 | Phase 3 | Situation |
|---|---|---|---|---|
| 4(XPP mode) | XPP | PXP | PPX | 12 V medium power mode with diagnostic |
| 5(SXP mode) | SXP | PSX | XPS | Low power 2 voltage mode with diagnostic |
| 6(XSS mode) | XSS | SXS | SSX | 48 V medium power with diagnostic |
| 7(PPP mode) | PPP | PPP | PPP | 12 V high power cranking mode |
| 8(PPS mode) | PPS | SPP | PSP | Normal 2 voltage mode |
| 9 (PSS mode) | PSS | SPS | SSP | Normal 2 voltage mode |
| 10 (SSS mode) | SSS | SSS | SSS | 48 V high power mode |

In the example table above, the battery module mode of the respective battery modules are provided for each phase. For example, when in power mode 5 (SXP mode), during the first phase (phase 1), the first battery module is operated in the series (S) mode, the second battery module is operated in the open (X) mode, and the third battery module is operated in the parallel (P) mode. During the second phase (phase 2) of power mode 5, the first battery module is operated in the parallel (P) mode, the second battery module is operated in the series (S) mode, and the third battery module is operated in the open (X) mode. During the third phase (phase 3) of power mode 5, the first battery module is operated in the open (X) mode, the second battery module is operated in the parallel (P) mode, and the third battery module is operated in the series (S) mode.

The MPC module 708 sets the duration (length) of each of the first, second, and third phases to optimize balancing of the SOCs of each battery string. For example, the battery strings (e.g., on average) of one battery module have lower SOCs than the other two battery modules, during charging the MPC module 708 may set the phase or phases that the one battery module is operated in the parallel (P) mode to be longer than the phase or phases that the other two battery modules. This will increase the SOCs of the other two battery modules less than the SOC of the one of the battery modules such that the SOCs are more balanced across the battery modules. During discharging, the battery strings (e.g., on average) of one battery module have lower SOCs than the other two battery modules, the MPC module 708 may set the phase or phases that the one battery module is operated in the parallel (P) mode to be shorter than the phase or phases that the other two battery modules. This will decrease the SOCs of the other two battery modules more than the SOC of the one of the battery modules such that the SOCs are more balanced across the battery modules.

The MPC module 708 also sets the duration (length/period) of each phase that each battery string is connected to the second positive terminal 214 to balance the individual SOCs of the battery strings of each module. For example, during charging, when one battery string of a battery module has a SOC that is lower than the other battery strings of that battery module, the MPC module 708 may set the duration for the one of the battery strings to be connected to the second positive terminal 214 to longer than the durations of the other battery strings of the battery module. This will increase the SOC of the one battery string of the battery module more than the SOCs of the other battery strings of the battery module such that the SOCs are more balanced within the battery module. The MPC module 708 does this for each battery module. During discharging, when one battery string of a battery module has a SOC that is lower than the other battery strings of that battery module, the MPC module 708 may set the duration for the one of the battery strings to be connected to the second positive terminal 214 to shorter than the durations of the other battery strings of the battery module. This will decrease the SOC of the one battery string of the battery module less than the SOCs of the other battery strings of the battery module such that the SOCs are more balanced within the battery module. The MPC module 708 does this for each battery module.

Figure 8:
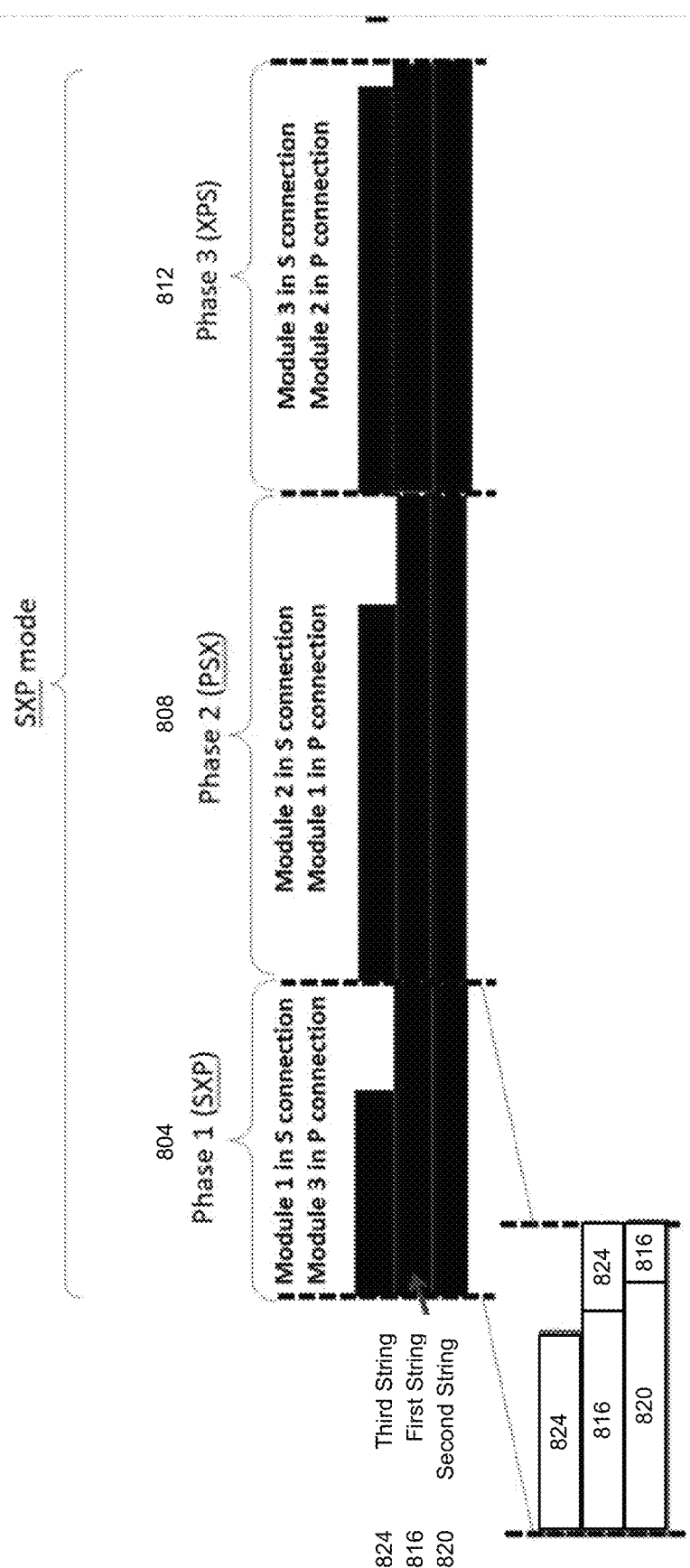
FIG. 8 includes an example time series for operation in a power mode during charging.

FIG. 8 includes an example time series for operation in power mode 5 (SXP) during charging. 804 is the first phase (phase 1), 808 is the second phase (phase 2), and 812 is the third phase (phase 3). As used herein, the MNO mode may mean that the first battery module is operating in mode M, the second battery module is operating in mode N, and the third battery module is operating in mode 0, where M, N, and 0 are each one of parallel (P), series (S), or open (X). For example, the first phase includes SXP mode where the first battery module is operated in the series (S) mode, the second battery module is operated in the open (X) mode, and the third battery module is operated in the parallel (P) mode. The second phase includes operation in the PSX mode where the first battery module is operated in the parallel (P) mode, the second battery module is operated in the series (S) mode, and the third battery module is operated in the open (X) mode. The third phase includes operation in the XPS mode where the first battery module is operated in the open (X) mode, the second battery module is operated in the parallel (P) mode, and the third battery module is operated in the series (S) mode.

In the example of FIG. 8, the MPC module 708 set the duration of the second phase to longer than the duration of the third phase, and the duration of the third phase to longer than the duration of the first phase. This allows for more charging of the battery strings of the first battery module (which is connected in the parallel (P) mode in the second phase) than the other battery modules and allows for more charging of the battery strings of the second battery module (which is connected in the parallel (P) mode in the third phase) than the battery strings of the third battery module. The third battery module is operated in the parallel (P) mode in the first phase.

During the first phase 804, the MPC module 708 connected the third battery string 824 of the third battery module to the second positive terminal 214 for a lesser duration than the first and second battery strings 816 and 820 of the third battery module. This allows the first and second battery strings 816 and 820 of the third battery module to be charged more than the third battery string 824 of the third battery module to balance the SOCs of the first, second, and third battery strings 816, 820, and 824 of the third battery module.

During the second phase 808, the MPC module 708 connected the third battery string 824 of the first battery module to the second positive terminal 214 for a lesser duration than the first and second battery strings 816 and 820 of the first battery module. This allows the first and second battery strings 816 and 820 of the first battery module to be charged more than the third battery string 824 of the first battery module to balance the SOCs of the first, second, and third battery strings 816, 820, 824 of the first battery module.

During the third phase 812, the MPC module 708 connected the third battery string 824 of the second battery module to the second positive terminal 214 for a lesser duration than the first and second battery strings 816 and 820 of the second battery module. This allows the first and second battery strings 816 and 820 of the second battery module to be charged more than the third battery string 824 of the second battery module to balance the SOCs of the first, second, and third battery strings 816, 820, 824 of the second battery module.

Control then returns to the first phase assuming that the power mode has not changed. In other words, control continues from phase 1 to phase 2 to phase 3 before repeating phases 1-3 in the same order.

While FIG. 8 is discussed as illustrating charging, similar is applicable to the situation of discharging. For example, if the SOC of the third strings of the first, second, and third battery modules are lower than the SOCs of the first and second strings of the first-third battery modules, respectively, the MPC module 708 may connect the third strings of the first-third battery modules during the respective phases to the second positive terminal 214 for shorter periods than the first and second strings of the first-third battery modules. This discharges the third strings less than the first and second strings and balances the SOCs of the battery strings.

Figure 9:
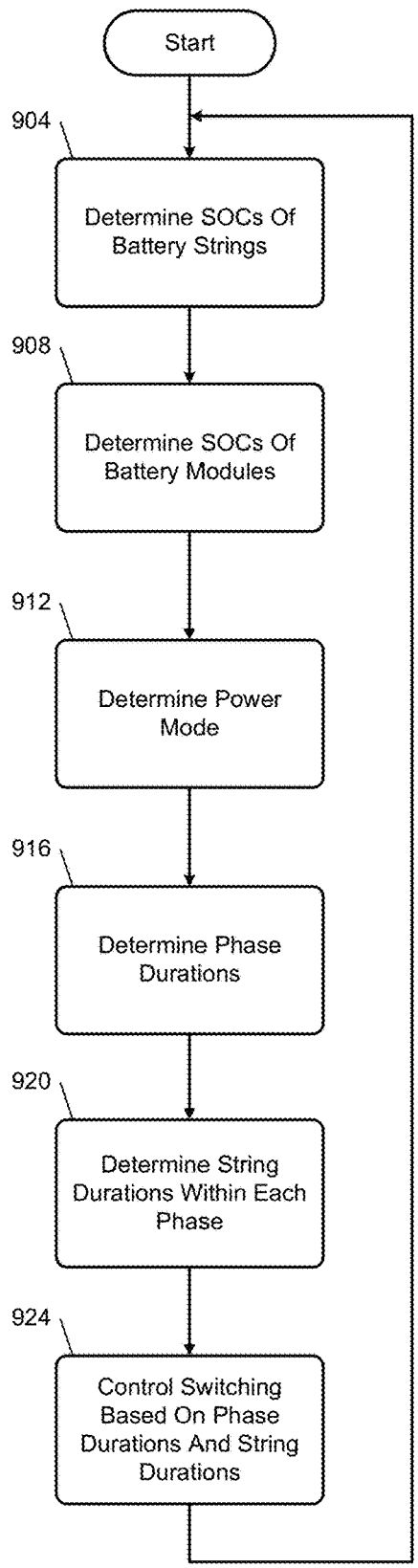
FIG. 9 is a flowchart depicting an example method of balancing the SOCs of the battery strings and battery modules of a battery.

FIG. 9 is a flowchart depicting an example method of balancing the SOCs of the battery strings of the battery modules of the battery 208. Control begins with 904 where the SOC module 718 determines the SOCs of the battery strings (first, second, and third) of each of the battery modules 324 (first, second, and third) of the battery 208. At 908, the SOC module 718 may determine SOCs of the battery modules (first, second, and third) based on the battery strings of the battery modules, respectively. For example, the SOC module 718 may determine an SOC of the first battery module based on an average of the SOCs of the battery strings (first, second, and third) of the first battery module. The SOC module 718 may determine an SOC of the second battery module based on an average of the SOCs of the battery strings (first, second, and third) of the second battery module. The SOC module 718 may determine an SOC of the third battery module based on an average of the SOCs of the battery strings (first, second, and third) of the third battery module.

At 912, the MPC module 708 determines the power mode. The MPC module 708 may select one of the power modes above, such as the SXP mode, the XPP mode, the XXP mode, or another one of the modes above.

At 916, the MPC module 708 determines the phase durations based on the power mode and the SOCs of the battery modules. For example, the MPC module 708 may set the durations of a phase when a battery module is to be connected in the parallel (P) mode to shorter than the durations of the other phases when the SOC of that battery module is less than the SOC of the other battery modules. The MPC module 708 determines the phase durations using MPC.

At 920, the MPC module 708 determines (initial) durations (periods) for connection of each string of each battery module within the phases. For example, during charging, the MPC module 708 may charge a battery string longer than other battery strings when the battery string has a lower SOC than the other battery strings. During discharging, the MPC module 708 may discharge a battery longer than the other battery strings when the battery string has a higher SOC than the other battery strings. The MPC module 708 determines the battery string durations using MPC. The MPC module 708 determines final durations (periods) based on the initial periods as discussed further below.

In various implementations 912 and 916 may be performed concurrently by the MPC module 708. The optimization cost criterion may be zero when all string SOCs are equal and may become larger with larger differences between the SOCs. One possible formulation of such a cost criterion is a weighted sum of squared differences between the SOCs of neighboring pairs in a cyclic chain that includes all of the strings, this sum taken over a planning horizon consisting of one or more complete cycles through the phases. Additional penalties may be added such as a cost on the total connection times of strings with the purpose of avoiding overheating any string. The variables in the optimization are the durations of the phases and the duration that each string is connected in P configuration. Minimization of the cost criterion is subject to the constraints 712. Given the output demands and predictions 728, the cost criterion can be evaluated by the MPC module 708 for any set of connection durations. The solution of the minimization problem is the set of phase durations and string connection durations that most nearly balance the string SOCs over the planning horizon, subject to the constraints 712 and taking into account any additional penalty terms.

At 924, the switching module 704 actuates the switches 232 according to the power mode, the phase durations, and the battery string durations. Control returns to 904 for a next loop.

Figure 10:
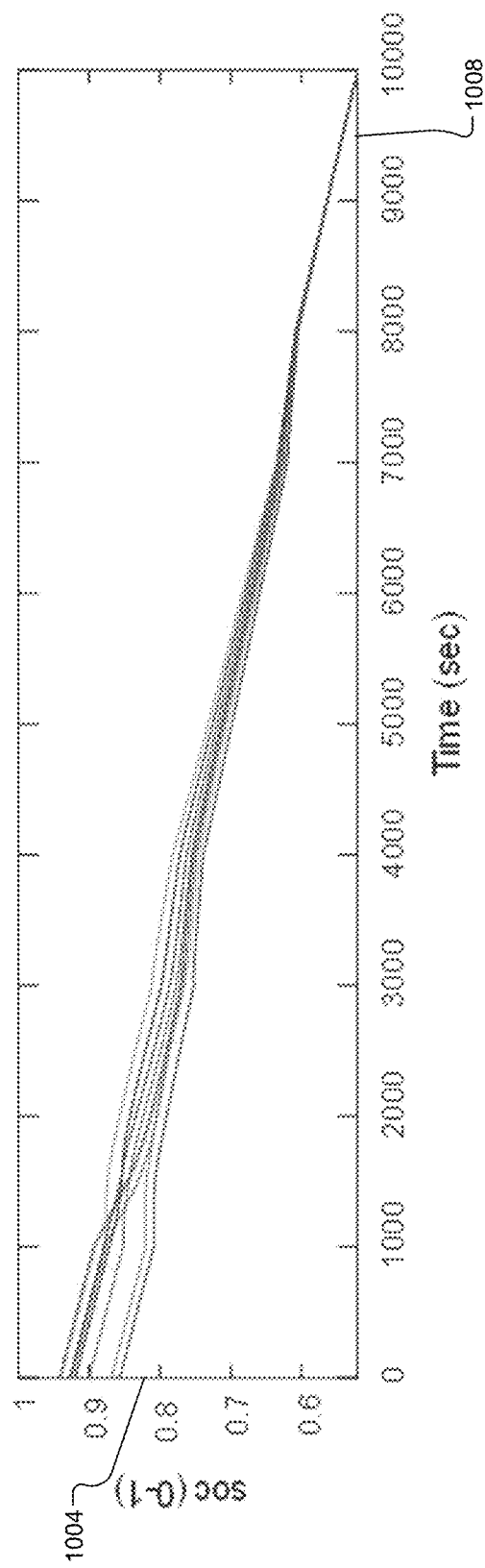
FIG. 10 includes an example graph of SOCs of battery strings over time during discharging using string and module balancing.

FIG. 10 includes an example graph of SOCs 1004 of battery strings over time 1008 during discharging according to the string and module balancing discussed herein. As illustrated, despite the SOCs differing initially, the SOCs become approximately equal relatively quickly.

Figure 11:
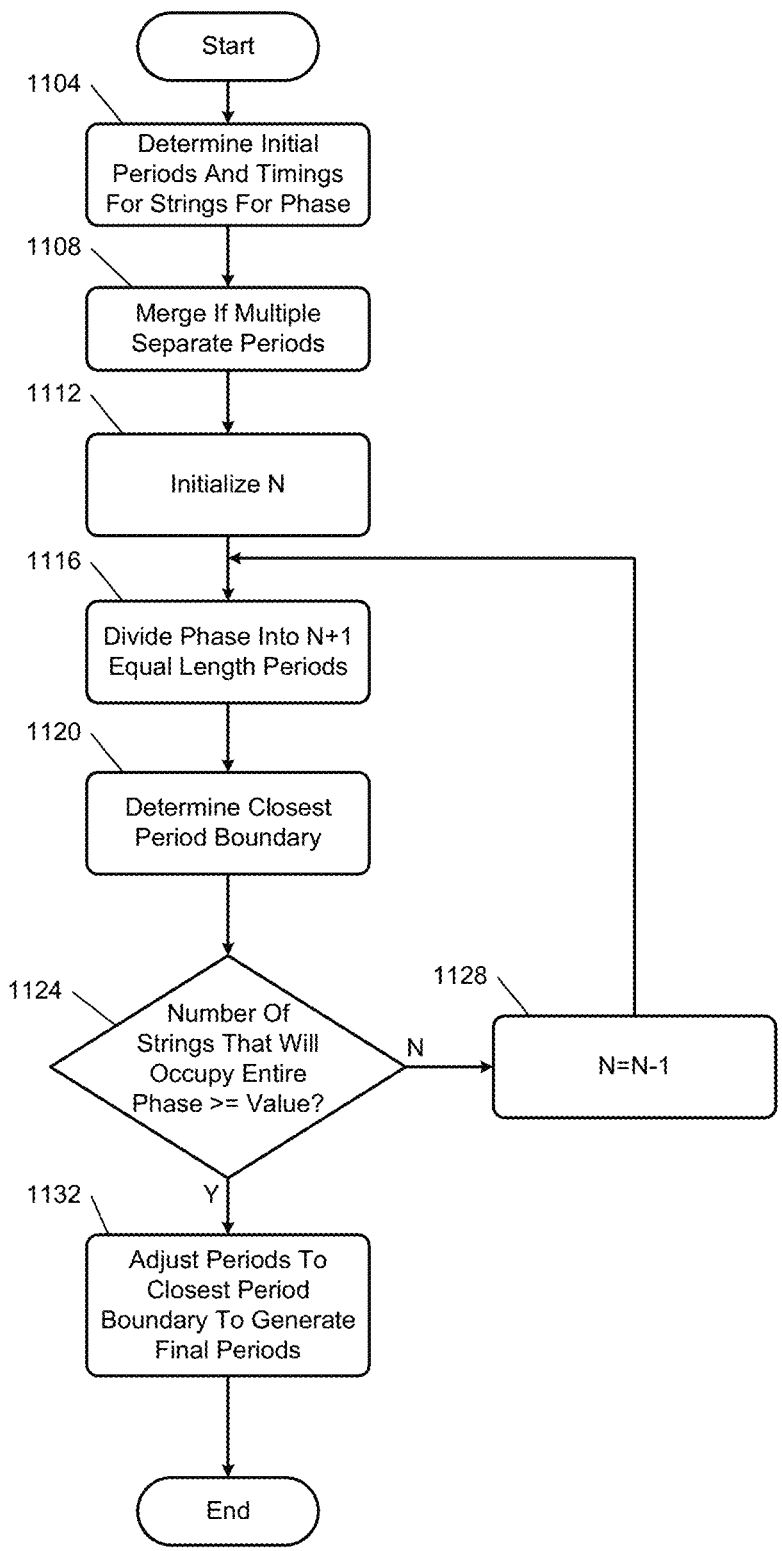
FIG. 11 is a flowchart depicting an example method of setting the periods of the battery strings to increase computational efficiency and decrease switching.
Figure 12:
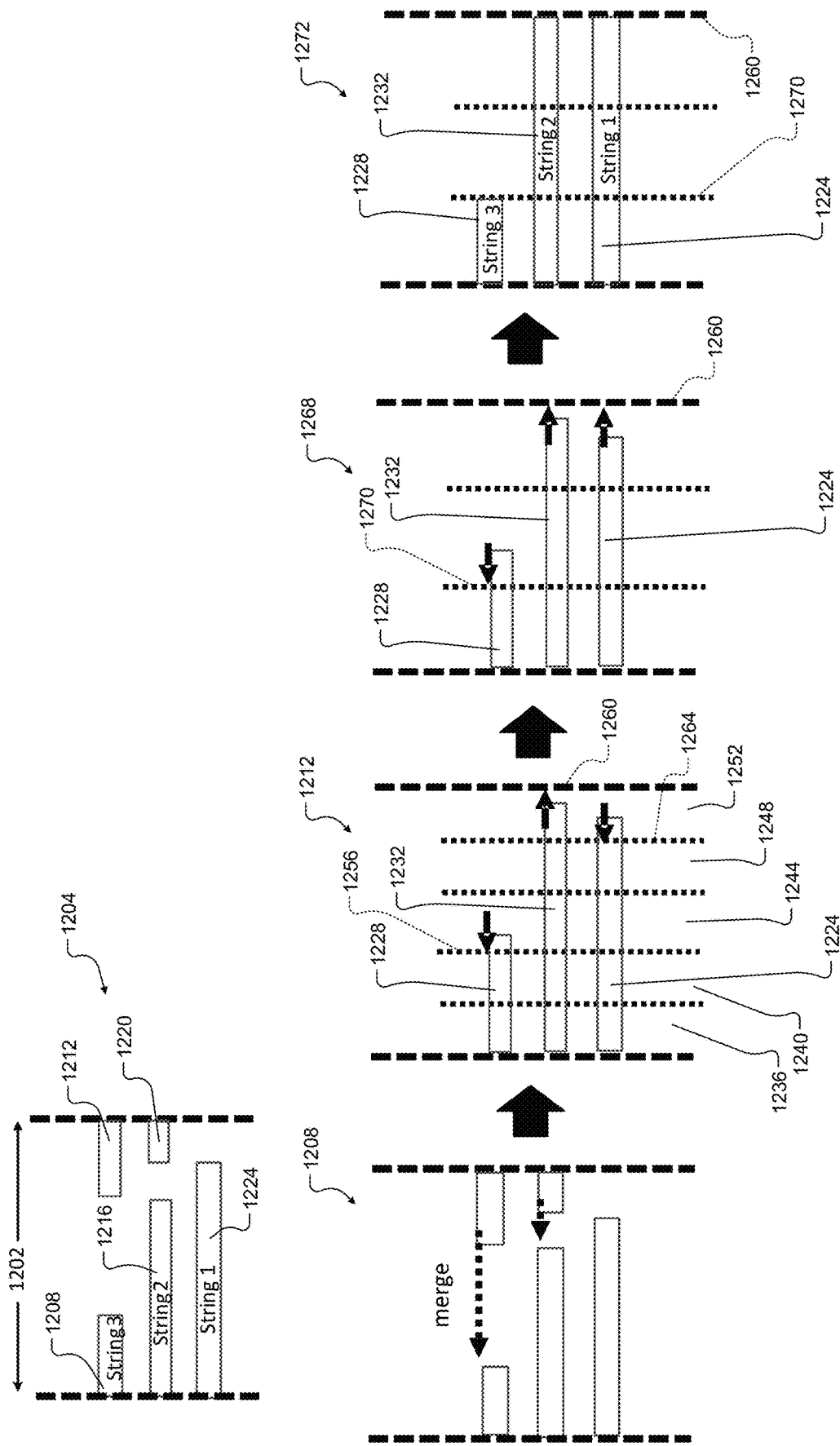
FIG. 12 includes an example illustration regarding setting the periods of the battery strings.

To implement the set of durations that minimizes the cost criterion, these durations are post-processed into a timed sequence of events for opening and closing the switches. FIG. 11 is a flowchart depicting an example method of setting the periods of the battery strings to increase computational efficiency and decrease switching. FIG. 12 includes an example illustration regarding concepts of FIG. 11.

Control begins with 1104 where the MPC module 708 determines the periods of the phases and initial periods for the battery strings for each phase as discussed above. Example initial periods for battery strings of a battery module to be operated in the parallel (P) mode for a phase 1202 are illustrated by 1204 of FIG. 12. The third battery string of the battery module is to be connected during periods 1208 and 1212 of the phase 1202. The second battery string of the battery module is to be connected during periods 1216 and 1220 of the phase 1202. The first battery string of the battery module is to be connected during period 1224 of the phase 1202.

At 1108, if a string is to be connected during multiple periods of a phase, the MPC module 708 combines the multiple periods of the phase into one continuous period having a length that is equal to a sum of the multiple periods. An example is illustrated by 1208 and 1212 of FIG. 12 where the periods 1208 and 1212 of the third battery string are added to produce period 1228. The periods 1216 and 1220 of the second battery string are also added to produce period 1232.

At 1112, the MPC module 708 initializes a counter value N to a predetermined value that is greater than two. In the example of FIG. 12, the MPC module 708 initializes N to 4. At 1116, the MPC module 708 divides the phase into N+1 periods of equal length. Examples of the N+1 equal length periods for N=4 are illustrated by 1236, 1240 1244, 1248, and 1252 in FIG. 12.

At 1120, the MPC module 708 compares the periods of the battery strings, respectively, with the boundaries of the N+1 equal length periods to determine a closest period boundary for each of the periods of the battery string. The period boundary of the last one of the N+1 equal length periods (e.g., 1252) is at the end of the phase 1202. The MPC module 708 determines the closest period boundary of each of the periods of the battery strings. For example, the period 1228 is closest to period boundary 1256, the period 1232 is closest to period boundary 1260 (the end of the phase 1202), and the period 1232 is closest to period boundary 1264.

At 1124, the MPC module 708 determines how many of the periods of the battery strings are closest to the end of the phase 1202 (1260) and determines whether the number of the periods that are closest to the end of the phase 1202 is greater than or equal to a predetermined value. The predetermined value is calibratable, is greater than zero, and may be, for example, 2. At 1212, only the period 1232 is closest to the end of the phase 1202. If 1124 is false, the MPC module 708 decrements the counter value N by 1 (e.g., sets N=N−1) at 1128, and control returns to 1116. This results in 1 less equal length period, such as illustrated by 1268 which includes 2 less equal length periods than 1212. Another iteration of 1116-1128 is performed between 1212 and 1268.

If 1124 is true, control continues with 1132. At 1132, the MPC module 708 adjusts the periods of the battery strings to the closest period boundaries, respectively, to produce final periods for the phase for the battery strings. In the example of FIG. 12, the MPC module 708 decreases the period 1228 of the third string to the period boundary 1270, increases the period of the second string to the period boundary 1260, and increases the period of the first string to the period boundary 1260. The adjusted periods are illustrated in 1272 of FIG. 12. Setting the periods for the battery strings in the manner described herein reduces computational effort (increases computational efficiency) and decreases switching of the switches. Decreasing switching increases battery life. Control continues with 924 as discussed above. While the example of FIG. 11 is shown as ending, control returns to 1104 and is shown for only one phase. One iteration of FIG. 11 may be performed for each phase.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery system comprising:
a first positive terminal;
a second positive terminal;
a negative terminal;
switches;
two battery modules, wherein each of the two battery modules includes three strings of battery cells that are configured to, at different times be:
connected in series and to the first positive terminal via first ones of the switches;
connected in parallel and to the second positive terminal via second ones of the switches; and
disconnected from both of the first and second positive terminals; and
a switch control module configured to:
determine state of charges (SOCs) of the strings of battery cells, respectively;
determine periods of phases, respectively, based on the SOCs;
determine first periods for connecting ones of the strings in parallel during one of the phases;
divide the one of the phases into N equal length periods with N period endings, respectively, one of the N period endings being at an end of the one of the phases,
where N is an integer greater than one;
selectively decrease N;
when a number of the first periods that end closest to the one of the N period endings is at least a predetermined value, adjust the first periods to the respective closest ones of the N period endings; and
selectively actuate the switches based on the periods of the phases and the periods for the strings of battery cells.

2. The battery system of claim 1 wherein the predetermined value is two.

3. The battery system of claim 1 wherein the switch control module is configured to selectively decrease N based on the number of the first periods that are closest to the one of the N period endings.

4. The battery system of claim 1 wherein the switch control module is configured to decrement N when the number of the first periods that are closest to the one of the N period endings is less than the predetermined value.

5. The battery system of claim 4 wherein the switch control module is configured to decrement N by one.

6. The battery system of claim 1 wherein the switch control module is configured to, when two first periods for connecting one of the strings in parallel during the one of the phases are separated by a period during which the one of the strings is to not be connected in parallel, joining the two first periods for connecting one of the strings in parallel during the one of the phases such that the two first periods are contiguous.

7. The battery system of claim 1 wherein the switch control module is configured to set a first period for a first one of the strings of one of the battery modules to longer than a second period for a second one of the strings of the one of the battery modules during charging when a first SOC of the first one of the strings is less than a second SOC of the second one of the strings.

8. The battery system of claim 1 wherein the switch control module is configured to set a first period for a first one of the strings of one of the battery modules to longer than a second period for a second one of the strings of the one of the battery modules during discharging when a first SOC of the first one of the strings is greater than a second SOC of the second one of the strings.

9. The battery system of claim 1 wherein the switch control module is configured to selectively set a first period for a first of the phases to longer than a second period for a second one of the phases during charging based on the SOCs of the strings.

10. The battery system of claim 1 wherein the switch control module is configured to selectively set a first period for a first of the phases to longer than a second period for a second one of the phases during discharging based on the SOCs of the strings.

11. The battery system of claim 1 wherein the switch control module is configured to, based on minimizing an error between the SOCs of the strings of battery cells, determine the periods of the phases and the first periods for the strings.

12. The battery system of claim 11 wherein the error is a sum of squared differences between the SOCs of the strings.

13. The battery system of claim 1 wherein each of the strings includes multiple battery cells connected in series.

14. The battery system of claim 13 wherein the multiple battery cells include four three volt battery cells.

15. The battery system of claim 1 wherein the switch control module is configured to control the switches such that one of the strings is not at the same time connected to both the first positive terminal and the second positive terminal.

16. The battery system of claim 1 wherein:
the first positive terminal is configured to output a first reference potential;
the second positive terminal is configured to output a second reference potential; and
the first reference potential is greater than the second reference potential.

17. A method for a battery, comprising:
determining state of charges (SOCs) of strings of battery cells, respectively, of a battery, the battery including:
a first positive terminal;
a second positive terminal;
a negative terminal;
switches;
two battery modules, wherein each of the two battery modules includes three strings of the battery cells that are configured to, at different times be:
connected in series and to the first positive terminal via first ones of the switches;
connected in parallel and to the second positive terminal via second ones of the switches; and
disconnected from both of the first and second positive terminals;
determining periods of phases, respectively, based on the SOCs;
determining first periods for connecting ones of the strings in parallel during one of the phases;
dividing the one of the phases into N equal length periods with N period endings, respectively, one of the N period endings being at an end of the one of the phases, where N is an integer greater than one;
selectively decreasing N;
when a number of the first periods that end closest to the one of the N period endings is at least a predetermined value, adjusting the first periods to the respective closest ones of the N period endings; and
selectively actuating the switches based on the periods of the phases and the periods for the strings of battery cells.

18. The method of claim 17 wherein the predetermined value is two.

19. The method of claim 17 wherein selectively decreasing N includes selectively decreasing N based on the number of the first periods that are closest to the one of the N period endings.

20. The method of claim 17 wherein selectively decreasing N includes decrementing N when the number of the first periods that are closest to the one of the N period endings is less than the predetermined value.

* * * * *